United States Patent [19]

Siems

[11] 4,031,506
[45] June 21, 1977

[54] MULTIPLEXER COMMUTATED HIGH PASS FILTER

[75] Inventor: Lee E. Siems, Houston, Tex.

[73] Assignee: Western Geophysical Company of America, Houston, Tex.

[22] Filed: Mar. 8, 1976

[21] Appl. No.: 664,614

[52] U.S. Cl. .............. 340/15.5 GC; 340/15.5 TS; 179/15 A; 179/15 BL; 340/183; 328/137; 328/151; 328/154; 307/243

[51] Int. Cl.² .................. G01V 1/22; H03K 17/56; H04Q 11/04

[58] Field of Search .............. 179/15 A, 15 BL; 340/15.5 TS, 15.5 DP, 151, 152 T, 183; 328/137, 151, 154; 307/243

[56] References Cited

UNITED STATES PATENTS

| | | | |
|---|---|---|---|
| 2,773,982 | 12/1956 | Trousdale | 328/154 |
| 2,900,504 | 8/1959 | Weiss | 328/154 |
| 2,958,857 | 11/1960 | Johnson et al. | 179/15 A |
| 3,604,950 | 9/1971 | Anderson | 307/243 |
| 3,659,054 | 4/1972 | Koch | 179/15 A |

Primary Examiner—Howard A. Birmiel
Attorney, Agent, or Firm—William A. Knox

[57] ABSTRACT

A multi-channel analog system comprises a plurality of channels each being adapted to receive analog signals from a signal source such as a seismic sensor. A multiplexer multiplexes the analog channels prior to converting the channels' signals into digital numbers. Each channel has a DC blocking capacitor connected to one terminal of a normally-open multiplexer switch; the other terminal of the switch is coupled to a multiplexer bus. In accordance with this invention, the bus is connected to a common resistor. Control means consecutively close the multiplexer switches so that the capacitor whose switch has been closed forms a high-pass filter with the common resistor. The resistor is preferably connected as the input resistor to an operational amplifier. The capacitors, the multiplexer, and the common resistor form a multiplexer-commutated high-pass filter which is particularly adapted for multi-channel seismic systems.

7 Claims, 3 Drawing Figures

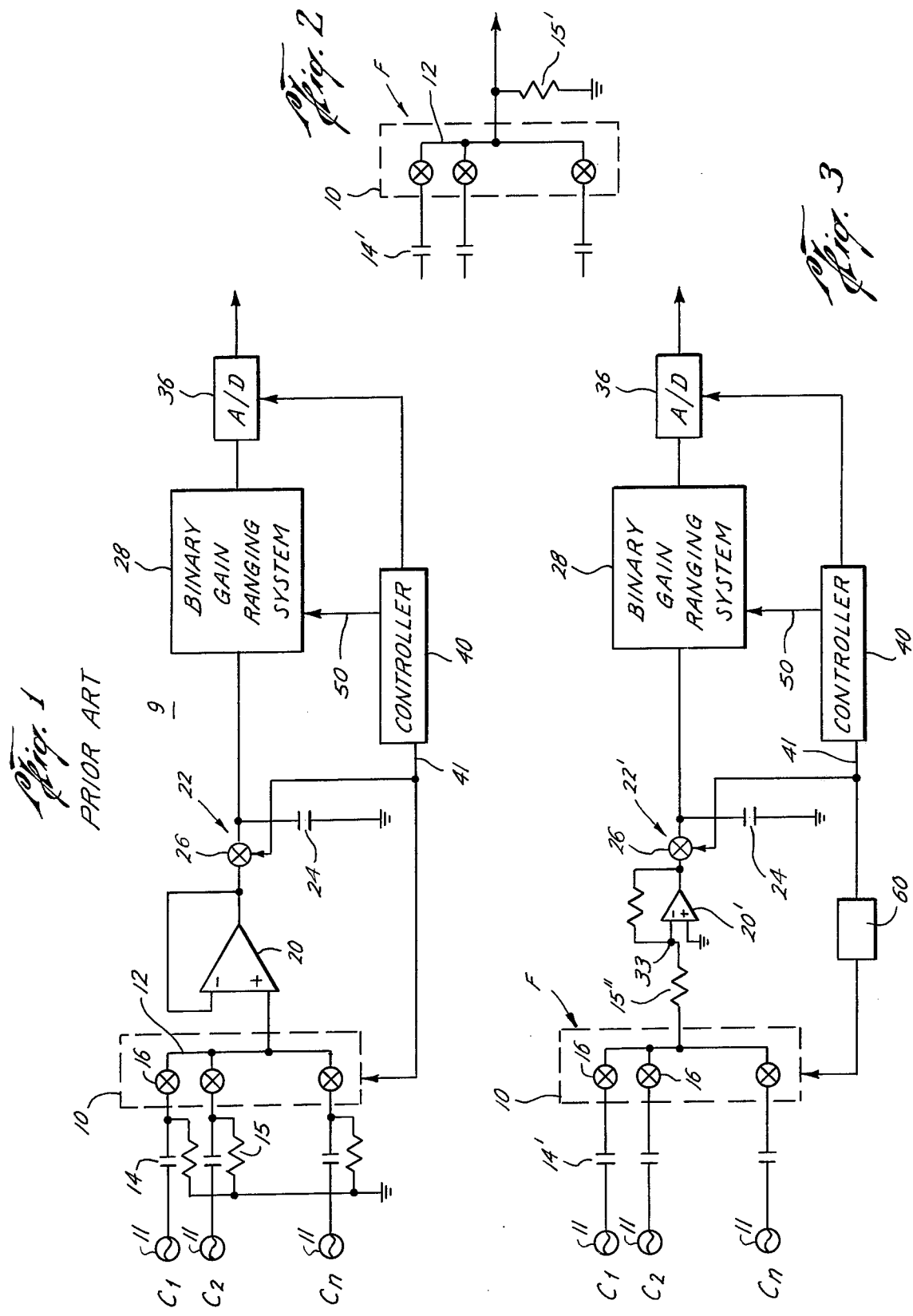

MULTIPLEXER COMMUTATED HIGH PASS FILTER

BACKGROUND OF THE INVENTION

Reference to Related Application

This application forms part of a group of patent applications filed concurrently having the following attorney's docket numbers, serial numbers, titles, and inventor(s):

| | | |
|---|---|---|
| WG | 229 | SEISMIC METHOD AND SYSTEM OF IMPROVED RESOLUTION AND DISCRMINATION - Carl H. Savit. Ser. No. 665,150 |
| LRS | 121 | GAIN RANGING AMPLIFIER SYSTEM - George Mioduski. Ser. No. 664,616 |
| LRS | 123 | SEISMIC DATA TELEMETER SYSTEM - Lee E. Siems, Paul M. Morgan. Ser. No. 665,151 |
| LRS | 124 | DECENTRALIZED SEISMIC DATA PROCESSING SYSTEM - Lee E. Siems et al. Ser. No. 664,618 |
| LRS | 126 | MULTIPLEXER OFFSET REMOVAL CIRCUIT - Lee E. Siems. Ser. No. 664,615 |
| LRS | 127 | MULTICHANNEL SEISMIC TELEMETER SYSTEM AND ARRAY FORMER - Lee E. Siems et al. Ser. No. 664,617 |

Field of the Invention

This invention relates in general to commutated high pass filters and more particularly to signal acquisition systems wherein a plurality of analog channels are multiplexed and the amplitudes of the sampled signals converted to digital words. The invention has particular utility to seismic analog-to-digital data acquisition systems.

Reference to Related Art

In a conventional multi-channel analog-to-digital conversion system, use is made of a multiplexer having a plurality of input terminals and a common output bus. Each input terminal to the multiplexer is connected to receive the output signal of an analog channel and its output bus is typically connected to an amplifier. Frequently, as in the seismic art, it is desired to eliminate the DC component of the analog signal received by each channel. Therefore, a high-pass R-C filter is typically connected between each input terminal to the multiplexer and the analog channel. Such a filter has a series capacitor and a shunt resistor and requires that the multiplexer bus terminate into a high-impedance load. Accordingly, in accordance with prior practice, the bus was connected to an amplifier having a high input impedance.

The conventional system of the foregoing character has several drawbacks, chief among which are: The capacitance value of the capacitor in each high-pass filter must be relatively large. Therefore the capacitor is bulky and expensive. Since each capacitor requires a separate resistor, the large number of such resistors adds considerably to the cost and bulk of the system and constitutes a serious impediment to miniaturization efforts. The required high input impedance amplifier connected to the output bus of the multiplexer seriously hampers the available design choices.

SUMMARY OF THE INVENTION

It is a broad object of the present invention to obviate the drawbacks by providing an improved system wherein the capacitance of each capacitor is considerably reduced, all capacitors share a common resistor connected to the output bus of the multiplexer, and the high-input impedance amplifier can be replaced by a low-input impedance operational amplifier to allow greater design flexibility.

The present invention provides a commutated, R-C, high pass filter for use with a multiplexer in a multi-channel analog system. Each channel receives an analog signal from a source such as a seismic sensor. Each channel contains a capacitor connected in series with a normally-open multiplexer switch which is connected to a multiplexer output bus. A common resistor is connected to the bus. A controller consecutively closes the switches so that the capacitor whose switch has been closed becomes connected to the common resistor to form therewith a high-pass R-C filter.

In a preferred embodiment, the common resistor is the input resistor to an operational amplifier. The cut-off frequency of the commutated filter can be varied by changing the dwell time of the switches.

BRIEF DESCRIPTION OF THE DRAWINGS

For a better understanding of this invention, reference may be made to the drawings wherein:

FIG. 1 is a schematic block diagram representation of a typical prior art seismic digital processing system;

FIG. 2 is a diagrammatic representation of the commutated high pass filter of this invention; and FIG. 3 is a schematic representation of a digital seismic system utilizing the equivalent commutated R-C filter shown in FIG. 2.

DETAILED DESCRIPTION OF THE PREFERRED EMBODIMENT

For a better understanding of the present invention, reference is made to FIG. 1 wherein is shown a typical prior art digital seismic data acquisition system 9 having a multiplexer 10 whose input channels $C_1$, $C_2$, $C_n$ are connected to a plurality of signal sources such as seismic sensors 11. The input channels are all connected to multiplexer output bus 12 through DC blocking capacitors 14, resistors 15, and switches 16. Each resistor 15 in combination with its capacitor 14 forms a high-pass R-C filter for its channel. Switches 16 are high-speed FET switches of any well known type.

The output of multiplexer bus 12 is typically connected to the non-inverting input of a unity-gain buffer amplifier 20 which may be an operational amplifier having a high-input impedance. The output of buffer amplifier 20 is connected to a sample-and-hold circuit 22 having a shunt capacitor 24 and a series switch 26. The output of circuit 22 is coupled to a binary gain-ranging amplifier (BGRA) 28, such as described in copending application Ser. No. 664,616 assigned to the same assignee.

A state controller 40 is interconnected with switches 16, 26, through a control bus 41 having a plurality of control lines. Controller 40 sequences the multiplexer to connect sequentially the signal-input channels $C_1$–$C_n$ to the output bus during a multiplexer scan cycle. The time required to complete a scan cycle is the scan time. Controller 40 also controls the operations of BGRA 28 through control lines 50.

The BGRA 28 is coupled to an analog-to-digital (A/D) converter 36 that converts the sampled analog signals into corresponding digital numbers. Other networks which are not germane to this invention have been purposely omitted from the drawings for the sake of clarity.

As previously mentioned, each prior art R-C high-pass filter comprises a series capacitor 14 and a shunt resistor 15 connected to ground. For seismic use each high-pass filter has a low cut-off frequency $f_o$ on the order of 1 Hz, although other cutoff frequencies can of course be employed.

The capacitance C is related to the resistance R and the cutoff frequency $f_o$ by:

$$C = 1/(2\pi R f_o). \qquad 1$$

For practical design reasons, R must be relatively low on the order of 10,000 ohms. Hence for $f_o = 1$ Hz, $C = 16$ microfarads. Such large size capacitors are relatively expensive and bulky. Thus, the known high-pass R-C filters in addition to being costly also impede subminiaturization.

The description of this invention with reference to FIGS. 2 and 3 will be facilitated by designating the same parts either with identical reference characters as in FIG. 1 or with identical reference characters followed by a prime (') to indicate a similarity in some respect.

Referring now to FIG. 2 the possibility arises that instead of supplying an individual shunt resistor 15 for each channel, it is possible to use a single common shunt resistor 15' on the output line of the multiplexer. As the multiplexer is advanced through its channel-select or scan cycle, the capacitor 14 connected in series with each multiplexer selected channel such as $C_1$, $C_2$, etc., combined with common shunt resistor 15' now constitutes the desired R-C filter for that channel.

When the circuit of FIG. 2 was tested however, it was discovered experimentally (and later proven theoretically) that the capacitance C is determined by:

$$C = [1/(2\pi R f_o)] [D/T] \qquad 2$$

where D is the dwell time, that is, the length of time that each switch is closed, and T is the channel-off time, that is, the length of time that each switch is open. The dwell time D is a function of the number of analog channels and the total time required to scan all of the channels. Thus, for a 16-channel multiplexer having a scan time of 1,000 microseconds (1 millisecond), the maximum dwell time D would be 62.5 microseconds per channel and the channel-off time T would be 937.5 microseconds.

The dwell time D, can be varied by means of dwell adjust circuit 60. Dwell adjust circuit 60 may be a one-shot such as National Semiconductor DM 74121. A one-shot is a circuit or device which can be used to modify the duration of a control pulse by stretching or shortening the pulse width. Pulse width adjustment is accomplished by means of a resistive/capacitive feedback network of a type well known to the electronics art. It is to be understood that, for any one multiplexer scan cycle, the desired dwell remains set at the same value. (FIG. 3.)

Equation (2) can be rearranged as $$f_o = [1/(2\pi RC)] [D/T] \qquad 3$$

Given constant values for R, C, T, the cutoff frequency of the filter can be changed by changing the dwell. In the above numerical example, the maximum dwell for a 1-millisecond scan-time is 62.5 microseconds. The shortest dwell time is set by the acquisition time of sample and hold circuit 22'. Typically, the acquisition time is 8 microseconds. Dwell adjust circuit 60 may be programmed to provide selectable dwell times ranging, for example, from a minimum dwell of 8 microseconds to a maximum dwell as set by the scan-time, which is 62.5 microseconds in the above example. Thus the cutoff frequency of the filter can be set to any desired value over a range of nearly 8:1.

The manner of employing the multiplexer-commutated R-C filter F, for example, in a digital seismic system is shown in FIG. 3. Since FIGS. 1 and 3 are in many respect similar, the description of FIG. 3 will be limited only to the changes introduced into FIG. 1 by the multiplexer-commutated R-C filter F of the present invention.

The heart of this invention, resides in the utilization of the normal channel-select cycle of a conventional multiplexer as commonly employed in multichannel seismic systems, in combination with a common shunt resistor connected to the multiplexer's output. By so doing, not only has the number of shunt resistors been reduced but the size of the required capacitors has been reduced by a factor of fifteen to one in the case of 16 input channels. In addition, by altering the dwell time, the cutoff frequency can be adjusted over a range of nearly eight to one.

In FIG. 3, a practical seismic system, it is preferable to use a low impedance operational amplifier 20'. In this embodiment, series resistor 15'' is the input resistor to the inverting input of amplifier 20'. The non-inverting input is connected to ground. Since both inputs must be at the same potential junction 33 is a virtual ground. Therefore, the filter F of FIG. 3 is the equivalent of the filter F of FIG. 2.

Accordingly, this invention employs a low-input impedance operational amplifier 20' having the filter's common resistor 15'' as its input resistor. The use of the operational amplifier 20' eliminates the serious design limitations imposed by the high-input impedance amplifier 20 of the prior art.

In sum, in accordance with the present invention, the use of a common resistor 15'' which successively becomes connected by switches 16 to capacitors 14' results in a considerable saving in the number of resistors and in the volume occupied by the resistors and capacitors. These advantages are of particular significance in miniaturized systems such as disclosed in the above-cited copending patent applications.

This invention has been described with particular reference to seismic systems. But it is to be understood that minor modifications and departures from the specific structure, circuitry and parametric values are within the scope of the specification. By way of example but not by way of limitation, the cutoff-frequency limits and the dwell-adjustment range can be altered substantially without departing from the teachings of this invention.

What is claimed is:

1. A multiplexer commutated high pass filter having a plurality of analog input terminals and an output terminal comprising:
    a multiplexer having a plurality of input terminals and a common output bus;
    a capacitor connected between each analog input terminal to the filter and the corresponding input terminals of the multiplexer;
    a resistor connected to said common output bus;
    seismic sensor units connected respectively to said input terminals; and
    control means connected to said multiplexer for sequentially connecting each capacitor to said resistor, said control means including means for varying the ratio of the dwell with respect to the channel-off time of said multiplexer to vary the cut-off frequency, where the dwell is the time period during which one of said seismic sensor units is connected to said resistor and the remainder of the time required to complete a scan cycle is the channel-off time.

2. The system of claim 1 wherein the cutoff frequency as given by the formula $f_o = \{1/(2\pi RC)\} \{D/T\}$ is less than 3 Hz, where R is the value of said resistor, C is the value of each said capacitor, D is the dwell time and T is the channel-off time.

3. In a multichannel, time-shared seismic signal data acquisition system having a plurality of analog channels, each channel being connected through a capacitor to an input terminal of a multiplexer having a common output bus, a sample-and-hold circuit, coupling means connecting said bus to said sample-and-hold circuit and a controller coupled to said multiplexer for sequentially connecting each analog channel to said sample-and hold circuit, the improvement comprising:
    a common resistor connected to the multiplexer common output bus whereby said capacitors successively form a multiplexer commutated high-pass filter with said resistor; and
    said coupling means include an operational amplifier having said common resistor connected to its inverting input.

4. The system of claim 3, including multiplexer dwell-adjusting means for varying the cutoff frequency of said multiplexer-commutated high pass filter.

5. A multiplexer commutated high pass filter comprising:
    a multiplexer having a plurality of analog input channels and a common output bus;
    capacitors series connected to said input channels;
    a shunt resistor coupled to the common output bus;
    control means coupled to said multiplexer for sequentially connecting each said series capacitor to said shunt resistor whereby said multiplexer, said capacitors, and said resistor coact to define a commutated high pass filter whose cutoff frequency is defined by the ratio of the dwell with respect to the channel-off time, where the dwell is the time period during which a one of said input channels is connected to said resistor, and the remainder of the time required to complete a scan cycle is the channel-off time.

6. The multiplexer-commutated filter as defined by claim 5 including:
    means associated with said control means for adjusting the ratio of the dwell with respect to the channel-off time to vary the filter's cutoff frequency.

7. The multiplexer-commutated filter as defined by claim 6 wherein:
    the cutoff frequency is given by the formula $f_o = \{1/(2 RC)\} \{D/T\}$, where R is the resistance of said resistor, C is the capacitance of each said capacitor, D is the dwell, and T is the channel-off time.

* * * * *